United States Patent
Sakimoto et al.

(10) Patent No.: US 8,649,241 B2
(45) Date of Patent: Feb. 11, 2014

(54) MEMORY SYSTEM, MEMORY CONTROLLER, AND SYNCHRONIZING APPARATUS

(75) Inventors: Katsuhiko Sakimoto, Kanagawa (JP); Makoto Ichida, Kanagawa (JP); Hiroshi Shimizu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 205 days.

(21) Appl. No.: 13/237,445

(22) Filed: Sep. 20, 2011

(65) Prior Publication Data

US 2012/0246367 A1 Sep. 27, 2012

(30) Foreign Application Priority Data

Mar. 25, 2011 (JP) ................................. 2011-068161

(51) Int. Cl.
*G11C 8/00* (2006.01)

(52) U.S. Cl.
USPC ............... 365/233.1; 365/233.11; 365/233.12

(58) Field of Classification Search
USPC ............... 365/233.1, 233.11, 233.12
See application file for complete search history.

(56) References Cited

U.S. PATENT DOCUMENTS

| | | | | |
|---|---|---|---|---|
| 7,560,956 | B2 * | 7/2009 | Waldrop | 326/93 |
| 8,195,954 | B2 * | 6/2012 | Sohn | 713/189 |
| 2006/0133165 | A1 * | 6/2006 | Lin et al. | 365/193 |

FOREIGN PATENT DOCUMENTS

| | | |
|---|---|---|
| JP | 11-15783 | 1/1999 |
| JP | 2002-300009 | 10/2002 |
| JP | 2007-86960 | 4/2007 |
| JP | 2007-318779 | 12/2007 |

\* cited by examiner

*Primary Examiner* — Vu Le
*Assistant Examiner* — Han Yang
(74) *Attorney, Agent, or Firm* — Oblon, Spivak, McClelland, Maier & Neustadt, L.L.P.

(57) ABSTRACT

According to one embodiment, there is provided a memory system including a bus master, a bus slave, and a memory device. The bus slave includes a synchronizing unit, and a speed-enhancing unit. The synchronizing unit is connected to a bus. The synchronizing unit receives the data in synchronism with a third clock. The third clock is in synchronous relation with a second clock and is slower than a first clock. The speed-enhancing unit enhances a transfer speed from a speed corresponding to the third clock to a speed corresponding to the second clock, by transferring the data received in the synchronizing unit to the memory device in synchronism with the second clock.

10 Claims, 9 Drawing Sheets

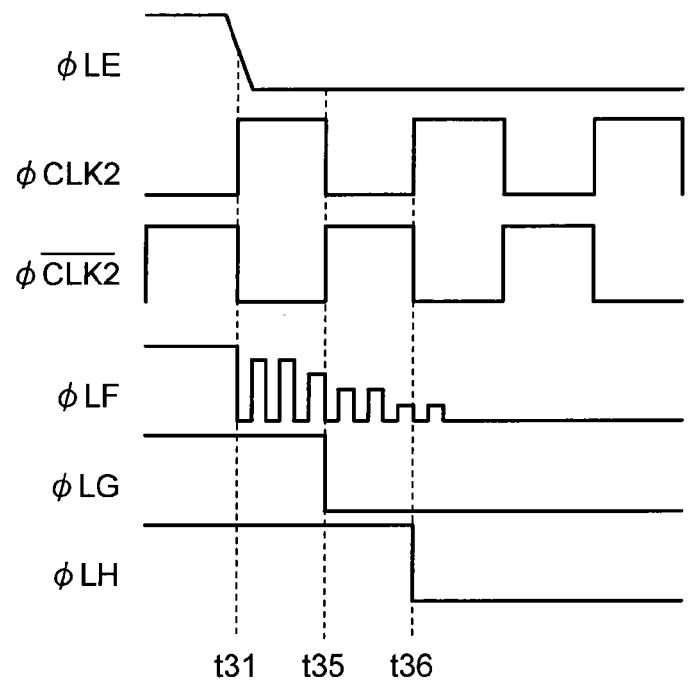
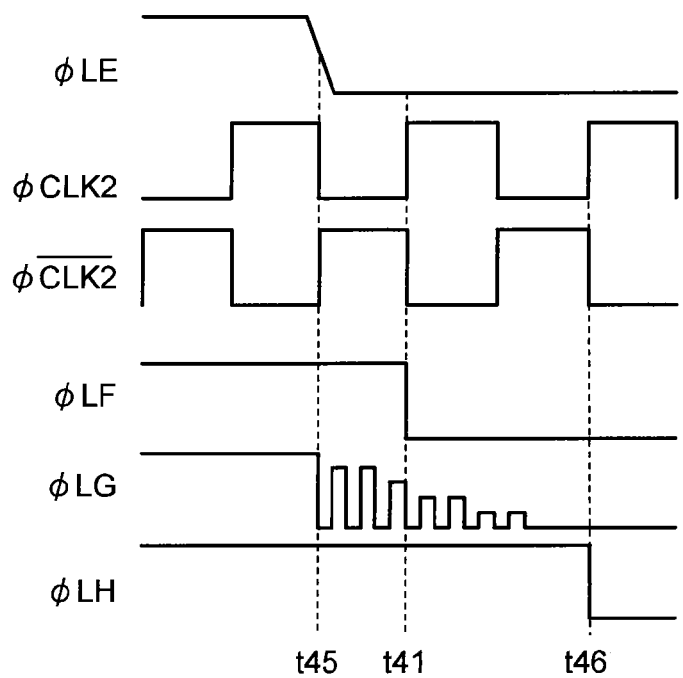

MEMORY SYSTEM, MEMORY CONTROLLER, AND SYNCHRONIZING APPARATUS

CROSS-REFERENCE TO RELATED APPLICATIONS

This application is based upon and claims the benefit of priority from Japanese Patent Application No. 2011-068161, filed on Mar. 25, 2011; the entire contents of which are incorporated herein by reference.

FIELD

Embodiments described herein relate generally to a memory system, a memory controller, and a synchronizing apparatus.

BACKGROUND

General techniques for synchronizing asynchronously transferred data into a certain clock include an art of receiving data in a circuit composed of two or more flip-flop stages driven by the clock. Usually, it is designed to synchronize by a clock of a longer period than the period of a metastable state, and no problem occurs practically if the flip-flop is composed of two stages.

BRIEF DESCRIPTION OF THE DRAWINGS

FIG. 10 is a diagram illustrating an operation of a bus slave I/F in the second embodiment;
FIG. 11 is a diagram illustrating an operation of a bus slave I/F in the second embodiment.

DETAILED DESCRIPTION

In a memory system in which a bus master is connected to high-speed memory by way of a bus and a memory controller, it is required to operate at a high operation speed (efficiently) on the high-speed memory, with respect to a memory I/F in the memory controller connected to the high-speed memory. At this time, in the memory system, if the bus slave I/F in the memory controller connected to the bus is operated at a same operation speed as the memory I/F, this bus slave I/F may possibly received data in a clock of a shorter period than the period reaching the metastable state. If data is received in a clock of a shorter period than the period reaching the metastable state, unstable data in the metastable state may be successively propagate in the memory controller, and the elements in the memory controller may malfunction.

By contrast, in the memory system of the embodiment, for example, the following features are assured.

According to one embodiment, there is provided a memory system including a bus master, a bus slave, and a memory device. The bus master transmits data by way of a bus. The bus slave receives the data by way of the bus. To the memory device, the data received in the bus slave is transferred. The bus master transmits the data in synchronism with a first clock. The memory device operates in synchronism with a second clock. The second clock is in an asynchronous relation with the first clock and is faster than the first clock. The bus slave includes a synchronizing unit, and a speed-enhancing unit. The synchronizing unit is connected to the bus. The synchronizing unit receives the data in synchronism with a third clock. The third clock is in synchronous relation with the second clock and is slower than the first clock. The speed-enhancing unit enhances a transfer speed from a speed corresponding to the third clock to a speed corresponding to the second clock, by transferring the data received in the synchronizing unit to the memory device in synchronism with the second clock.

Exemplary embodiments of a memory system, a memory controller, and a synchronizing apparatus will be explained below in detail with reference to the accompanying drawings. The present invention is not limited to the following embodiments.

First Embodiment

Figure 1:
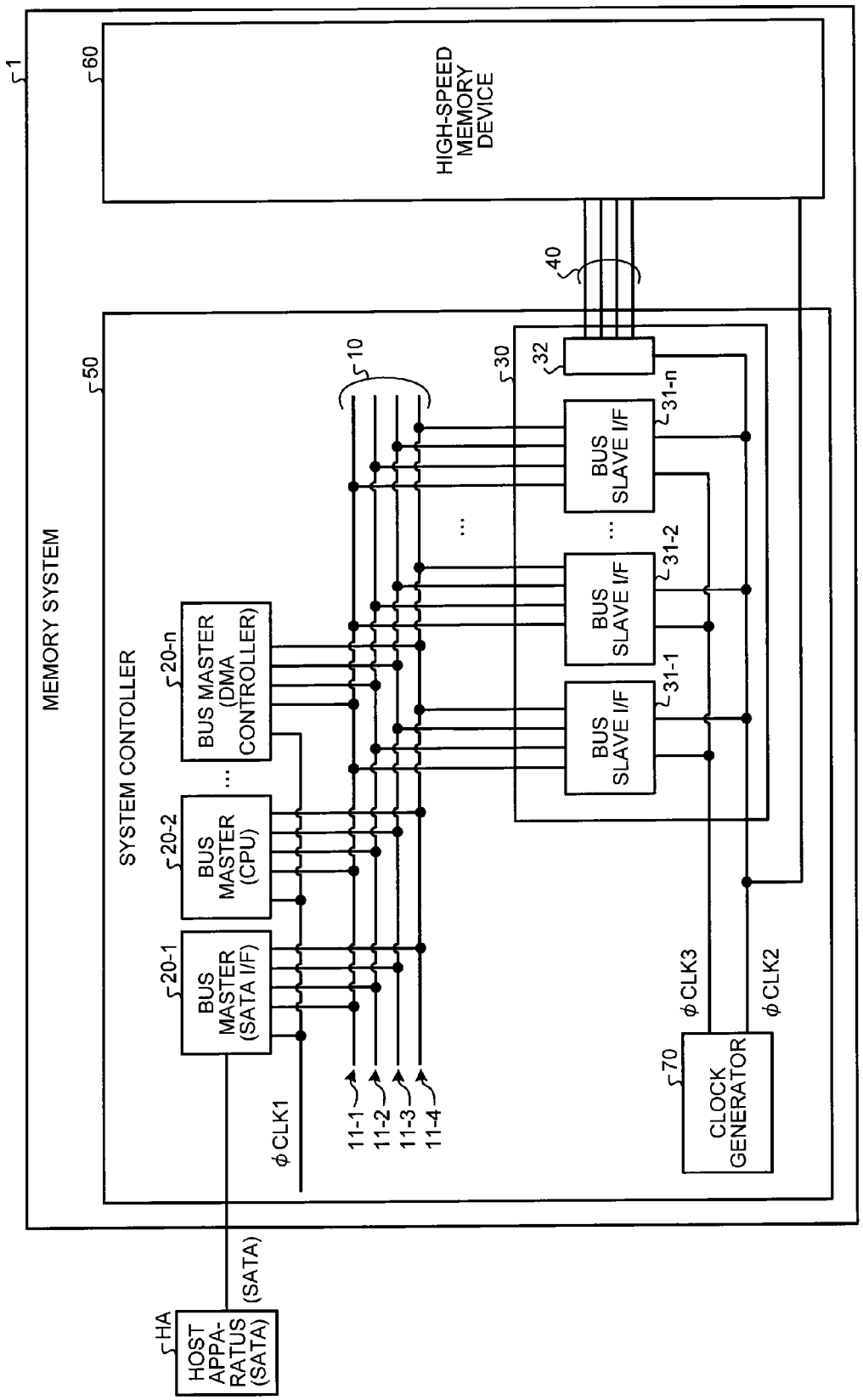
FIG. 1 is a diagram illustrating a configuration of a memory system in a first embodiment.

A memory system 1 in a first embodiment is described by referring to FIG. 1. FIG. 1 is a diagram illustrating a configuration of a memory system 1.

The memory system 1 functions as an external storage medium on a host apparatus HA, and is, for example, SSD (solid state drive) or memory card. The host apparatus HA includes, for example, a personal computer or a CPU core.

In the recent trend for saving of power consumption, it is required to suppress the power consumption in the memory system 1, but it is also demanded to enhance the performance, and a high-speed memory device 60 must be used. If the system clock frequency of the memory system 1 is low, a block corresponding to the high-speed memory device 60 (for example, high-speed memory controller 50) must operate at a high frequency.

Herein, the memory system 1 includes a low-speed bus 10, a plurality of bus masters 20-1 to 20-$n$, a high-speed memory device 60, a high-speed bus 40, a high-speed memory controller (bus slave) 30, and a clock generator 70. The low-speed bus 10, the plurality of bus masters 20-1 to 20-$n$, the high-speed memory controller (bus slave) 30, and the clock generator 70 are included in a system controller 50.

The low-speed bus 10 connects between the plurality of bus masters 20-1 to 20-$n$ and the high-speed memory controller (bus slave) 30, and mediates the communication between the plurality of bus masters 20-1 to 20-$n$ and the high-speed memory controller 30. The low-speed bus 10 has a plurality of lines 11-1 to 11-4 for transferring data at a speed corresponding to clock φCLK1. The low-speed bus 10 is a bus conforming, for example, to AHB (Advanced High-performance Bus), and the speed corresponding to clock φCLK1 is, for example, 100 MHz. That is, the frequency of the bus clock supplied to the low-speed bus 10 is, for example, 100 MHz.

The plurality of bus masters 20-1 to 20-n are connected to the low-speed bus 10. Each of the bus masters 20-1 to 20-n functions as a principal element as a bus slave for actively transferring data to the high-speed memory controller 30 by way of the low-speed bus 10. That is, the bus masters 20-1 to 20-n transmit data to the high-speed memory controller 30 by way of the low-speed bus 10. The bus masters 20-1 to 20-n are synchronized with clock φCLK1, and transmit data. In other words, the data transmission speed by the bus masters 20-1 to 20-n is, for example, 100 MHz.

The bus master 20-1 is, for example, SATA I/F. For example, the bus master 20-1 transmits a data train corresponding to the command or data received from the host apparatus HA by way of an external bus (SATA) to the high-speed memory device 60 by way of the low-speed bus 10, the high-speed memory controller 30, and the high-speed bus 40.

The bus master 20-2 is, for example, a CPU. That is, the bus master 20-2 controls comprehensively the constituent elements of the memory system 1. For example, the bus master 20-2, when receiving a command from the host apparatus HA by way of the bus master (SATA I/F) 20-1 and the low-speed bus 10, generates a specified command according to the received command, and transmits a data train showing this command to high-speed memory device 60 by way of the low-speed bus 10, the high-speed memory controller 30, and the high-speed bus 40.

The bus master 20-n is, for example, a DMA controller. That is, the bus master 20-n transfers data between memories without passing through the CPU. For example, the bus master 20-n transmits the data being read out from other memory device (not illustrated) to the high-speed memory device 60 by way of the low-speed bus 10, the high-speed memory controller 30, and the high-speed bus 40.

The bus masters 20-1 to 20-n may also include NAND controller, ECC module, encrypting module, and others. The NAND controller controls writing of data into NAND type flash memory (NAND memory) not illustrated, or reading of data from the NAND memory. The ECC module executes ECC processing (error correction processing) on the data being read out from the NAND memory or the data to be written into the NAND memory.

The high-speed memory device 60 functions as a cache region for data transfer between, for example, the host apparatus HA and the NAND memory, and a working region to be used by the bus master (CPU) 20-2. The high-speed memory device 60 includes, for example, DRAM (dynamic random access memory), FeRAM (ferroelectric random access memory), MRAM (magnetoresistive random access memory), PRAM (phase change random access memory), and others. In particular, the high-speed memory device 60 may be, for example, a DDR3-SDRAM.

When the high-speed memory device 60 is, for example, DDR3-SDRAM, the minimum operating frequency is 333 MHz. That is, the frequency of the clock φCLK2 supplied to the high-speed memory device 60 is, for example, 333 MHz.

Herein, clock φCLK2 is not frequency-multiplied by clock φCLK1, but in an asynchronous relation with clock φCLK1. Also, clock φCLK2 is faster than clock φCLK1.

The NAND memory (not illustrated) has a memory cell array having a plurality of memory cells formed in a matrix, and the individual memory cells can store multiple values by making use of an upper page and a lower page. In the NAND memory, data is erased in block unit, but data is written in or read out in page unit. A block is a group of plural pages. In the NAND memory, internal data management by the bus master (CPU) 20-2 is executed in cluster unit, and data is updated in sector unit. In this embodiment, a page is formed as a unit gathering plural clusters, and a cluster is defined as a unit gathering plural sectors. A sector is a minimum access unit of data from the host apparatus HA, and has a size of, for example, 512B. The host apparatus HA designates the data to be accessed by LBA (logical block addressing) in sector unit.

A high-speed bus 40 connects between the high-speed memory controller 30 and the high-speed memory device 60, and mediates communications between the high-speed memory controller 30 and the high-speed memory device 60. The high-speed bus 40 has plural lines for transferring data at a speed corresponding to clock φCLK2. The high-speed bus 40 is, for example, a bus conforming to the standard of AHB (advanced high-performance bus), and the speed corresponding to clock φCLK2 is, for example, 333 MHz. That is, the frequency of the bus clock supplied to the high-speed bus 40 is, for example, 333 MHz.

The high-speed memory controller 30 is connected to the plural bus masters 20-1 to 20-n by way of a low-speed bus 10, and is also connected to the high-speed memory device 60 by way of the high-speed bus 40. The high-speed memory controller 30, as a bus slave, passively waits for data transmitted from the bus masters 20-1 to 20-n, and receives service of data transfer by the bus masters 20-1 to 20-n. In other words, the high-speed memory controller 30 receives clock φCLK2 and clock φCLK3, and by using these clocks, receives data from the bus masers 20-1 to 20-n, and transfers to the high-speed memory device 60.

Figure 4:
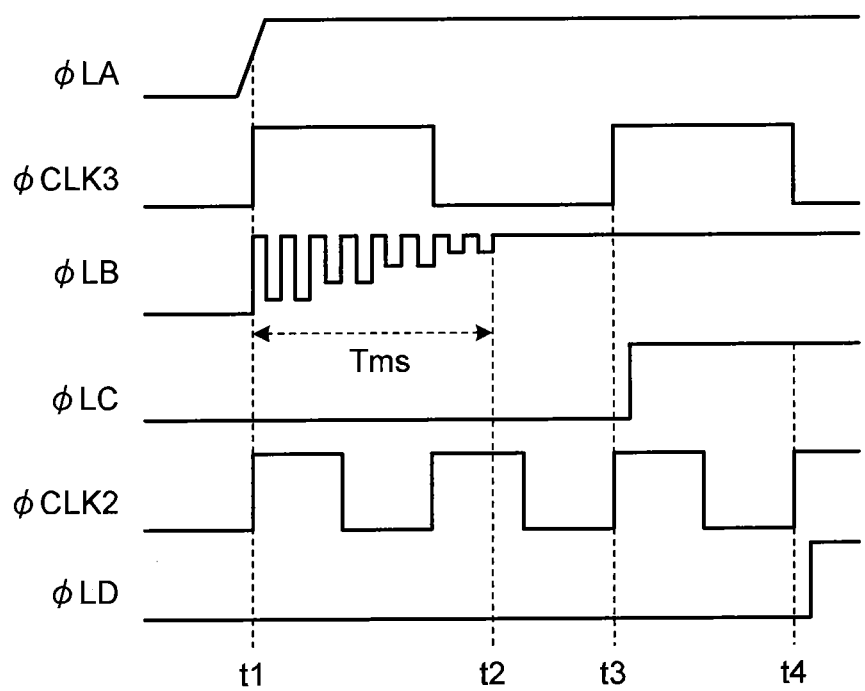
FIG. 4 is a diagram illustrating an operation of a bus slave I/F in the first embodiment.

Herein, clock φCLK3 is frequency-divided from clock φCLK2 by an integer, and is in a synchronous relation with clock φCLK2 (see FIG. 4). Also, clock φCLK3 is slower than clock φCLK2. Further, clock φCLK3 may be slower than clock φCLK1.

A clock generator 70 generates clock φCLK2 and clock φCLK3, and supplies to the high-speed memory controller 30. The clock generator 70 also supplied clock φCLK2 to the high-speed memory device 60.

The clock generator 70, for example, receives a reference clock from outside, frequency-multiplies by K1 (integer) times, generates clock φCLK2, frequency-multiplies the reference clock by K2 (integer, K2>K1) times, and generates clock φCLK3. Or, clock φCLK2 is received from outside, and this clock φCLK2 is frequency-multiplied by a specified integer times, and clock φCLK3 is generated. Alternatively, clock φCLK3 is received from outside, and this clock φCLK3 is frequency-divided by a specified integer times, and clock φCLK2 is generated.

Next, the configuration of the high-speed memory controller 30 is described below while referring to FIG. 1.

The high-speed memory controller 30 has plural bus slave interfaces (plural synchronizing devices) 31-1 to 31-n, and a memory interface 32.

The plural bus slave interfaces 31-1 to 31-n are individually connected to the low-speed bus 10. That is, the bus slave interfaces 31 have I/F circuits connected to each line 11 of the low-speed bus 10, for example, by the number of lines 11.

The memory interface 32 is connected to the high-speed bus 40. For example, the memory interface 32 has I/F circuits connected to each line of the high-speed bus 40 by the number of lines.

In the high-speed memory controller 30, as illustrated in FIG. 1, each bus slave interface 31 operates by using two clocks, that is, clock φCLK2 of high speed and clock φCLK3 of lower speed, whereas other constituent elements are operating by using clock φCLK2 of high speed without using clock φCLK3. For example, the memory interface 32 is synchronized with clock φCLK2 of high speed, and receives data from specified constituent elements from the bus slave interfaces 31. Also, the memory interface 32 is synchronized with clock φCLK2 of high speed, and transmits data to the high-speed bus 40.

Figure 2:
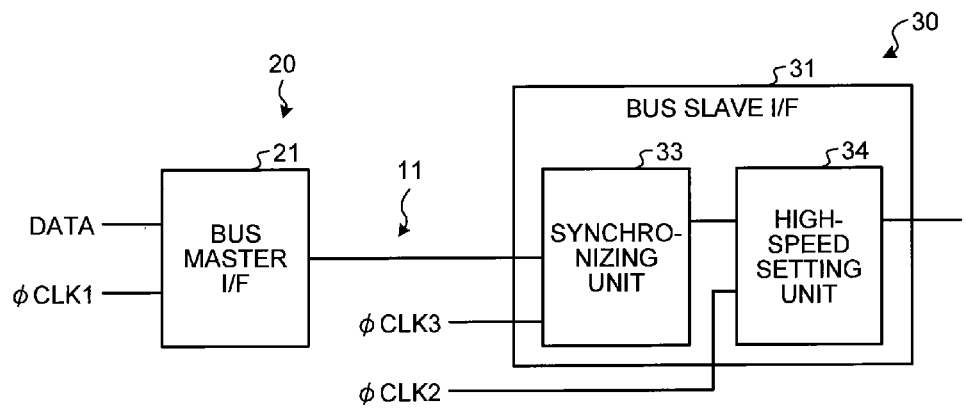
FIG. 2 is a diagram illustrating a configuration of a bus slave I/F in the first embodiment.
Figure 3:
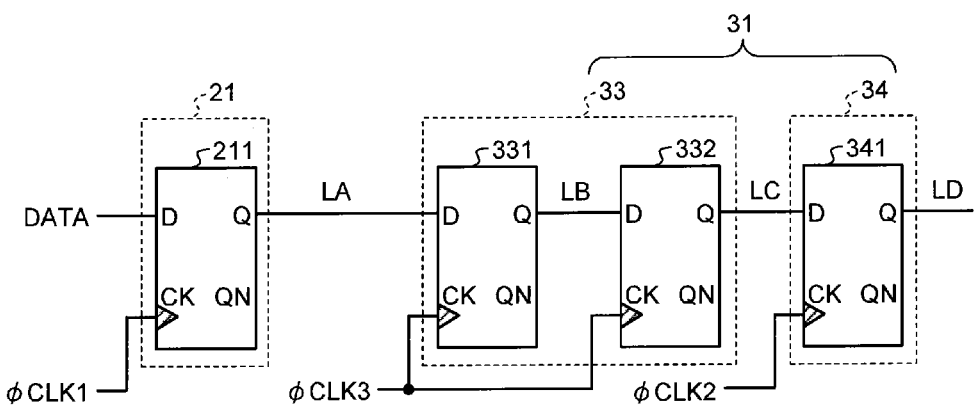
FIG. 3 is a diagram illustrating a configuration of a bus slave I/F in the first embodiment.

The internal structure of each bus slave interface 31 is explained by referring to FIG. 2 and FIG. 3. FIG. 2 and FIG. 3 are examples of construction of I/F circuit connected to one line 11 in the bus slave interface 31. The I/F circuit connected to other lines 11 in the bus slave interfaces 31 is also similar to that illustrated in FIG. 2 and FIG. 3.

The bus slave interface 31 has a synchronizing unit 33 and a speed-enhancing unit 34.

The synchronizing unit 33 is, as illustrated in FIG. 2, connected to the bus master interface 21 in the bus master 20 via the line 11. The bus master interface 21 is synchronized with clock φCLK1, and holds the data received from a front stage, and is also synchronized with clock φCLK1, and transmits data to the synchronizing unit 33. The synchronizing unit 33 receives clock φCLK3 from the clock generator 70 (see FIG. 1). The synchronizing unit 33 is synchronized with clock φCLK3, and receives data on the line 11. The synchronizing unit 33 is also synchronized with clock φCLK3, and transfers data to the speed-enhancing unit 34. Herein, clock φCLK3 is slower than clock φCLK2 of high speed, but is in a synchronous relation with clock φCLK2 of high speed. Accordingly, the synchronizing unit 33 controls and changes the transfer speed of the data transferred at a speed not synchronous with clock φCLK2 of high speed, to a speed synchronous with clock φCLK2 of high speed (that is, synchronizing).

More specifically, the synchronous unit 33 has, as illustrated in FIG. 3, a flip-flop (first flip-flop) 331 and a flip-flop (second flip-flop) 332. The flip-flop 331 has its input terminal D connected to the line 11 (line LA), its clock terminal CK connected to the clock generator 70 (see FIG. 1), and its output terminal Q connected to the flip-flop 332. The flip-flop 332 has its input terminal D connected to the flip-flop 331, its clock terminal CK connected to the clock generator 70 (see FIG. 1), and its output terminal Q connected to the speed-enhancing unit 34.

The bus master interface 21 has a flip-flop 211. The flip-flop 211 has its input terminal D connected to a front stage in the bus master 20, its clock terminal CK connected to a second clock generator (not illustrated), and its output terminal Q connected to the line 11.

The speed-enhancing unit 34 is, as illustrated in FIG. 2, connected to the synchronizing unit 33. The speed-enhancing unit 34 holds the data transferred from the synchronizing unit 33 in synchronism with clock φCLK2 of high speed, and transfers the held data to a rear stage in synchronism with clock φCLK2 of high speed. In other words, the speed-enhancing unit 34 transfers the data received from the synchronizing unit 33 to the high-speed memory device 60 side in synchronism with clock φCLK2 of high speed. As a result, the speed-enhancing unit 34 controls and changes the transfer speed of the data from the speed corresponding to clock φCLK3 to a speed corresponding to clock φCLK2 of high speed.

More specifically, as illustrated in FIG. 3, the speed-enhancing unit 34 has a flip-flop (third flip-flop) 341. The flip-flop 341 has its input terminal D connected to the flip-flop 332, its clock terminal CK connected to the clock generator 70 (see FIG. 1), and its output terminal Q connected to a rear stage.

The operation of each bus slave interface 31 is explained by referring to FIG. 4. FIG. 4 is an example illustrating the operation of the I/F circuit connected one line 11 in the bus slave interface 31. The operation of the I/F circuit connected to other lines 11 in the bus slave interface 31 is similar to that illustrated in FIG. 4.

Herein, the line 11 between the bus master interface 21 and the flip-flop 331 is referred to as LA, the line between the flip-flop 331 and the flip-flop 332 is referred to as LB, the line between the flip-flop 332 and the flip-flop 341 is referred to as LC, and the line between the flip-flop 341 and the rear stage is referred to as LD.

At timing t1, the flip-flop 331 holds the data on line LA in synchronism with rise of clock φCLK3. At this time, clock φCLK1 used in transmission of data φLA, and clock φCLK3 used in the flip-flop 331 are mutually in an asynchronous relation. For example, clock φCLK1 has a frequency of 100 MHz, and clock φCLK3 has a frequency of 166 MHz, and is not in a frequency-multiplied relation with clock φCLK1.

Accordingly, data φLA on line LA is in the midst of setup time of transition from L level to H level. That is, the flip-flop 331 holds the data of which level is not established, and is in a metastable state, and data φLB of a level oscillated to line LB is output from its output terminal G.

At timing t2, the flip-flop 331 exits a metastable state, and outputs data φLB of stable H level onto line LB.

At timing t3, the flip-flop 332 holds data φLB on line LB in synchronism with rise of clock φCLK3. Immediately after, the flip-flop 332 outputs signal φLC of H level of similar level to the held data φLB to line LC.

At timing t4, the flip-flop 341 holds data φLC on line LC in synchronism with rise of clock φCLK2. Immediately after, the flip-flop 341 outputs signal φLD of H level of similar level to held data φLC to line LD. As a result, the transfer speed of the data is increased from the speed corresponding to clock φCLK3 to the speed corresponding to clock φCLK2. For example, clock φCLK2 has a frequency of 333 MHz.

As illustrated in FIG. 4, the period of clock φCLK3 is sufficiently longer than term Tms of the flip-flop 331 staying in a metastable state. In other words, term Tms of the flip-flop 331 staying in a metastable state is predetermined statistically by calculation from the process values used in manufacture of the flip-flop 331. Then, clock φCLK3 is determined by frequency-dividing clock φCLK2 of high speed, so that the period of clock φCLK3 may be longer than the predicted term Tms of metastable state. As a result, propagation of metastable state of the flip-flop 331 to the flip-flop 332 can be prevented.

Figure 13:
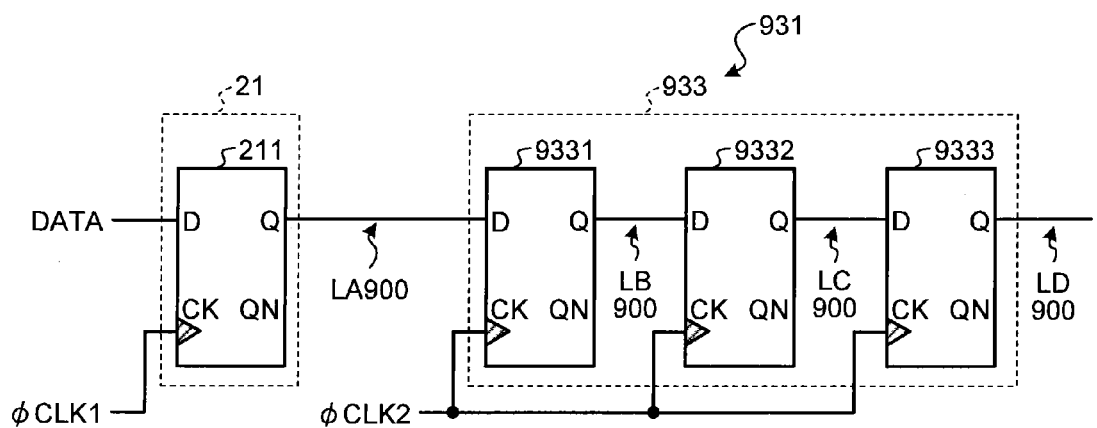
FIG. 13 is a diagram illustrating a configuration of a bus slave I/F in a comparative example.

Consider a case where, as illustrated in FIG. 13, three flip-flops 9331 to 9333 are all operating in synchronism with clock φCLK2 of high speed, in the synchronizing unit 933 in each bus slave interface 931. That is, in the semiconductor circuit using plural clocks in asynchronous state, a metastable state due to asynchronous transfer cannot be avoided. For example, at timing t901 illustrated in FIG. 14, the flip-flop 9331 holds data φLA900 not established in level on line LA 900, and it is set in a metastable state, and data φLB900 of a level oscillated to line LB 900 is output from its output terminal Q. Further, as the semiconductor circuit is enhanced in speed, an asynchronous signal may be received in a clock of a shorter period than the term of metastable state. To solve this problem, it may be proposed to receive by using more than three flip-flops. This case is based on a thought that the occurrence probability of metastable state can be determined in a design stage, and that the probability can be lowered by increasing the number of stages, and propagation of metastable state to the circuit of a next stage can be prevented.

Figure 14:
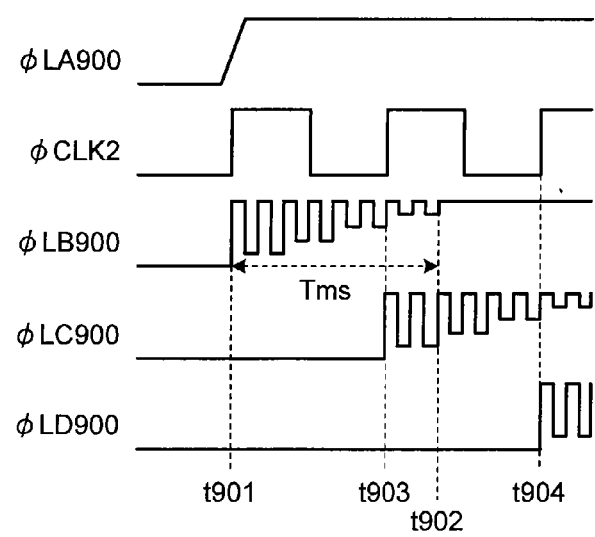
FIG. 14 is a diagram illustrating an operation of a bus slave I/F in a comparative example.

However, in this case, because of synchronization in a shorter period than the term Tms of metastable state, at timing t903 before timing t902 when unstable data φLB900 in metastable state settles from the flip-flop 9331 of the first stage, the flip-flop 9332 of the second stage holds the data on line LB 900. As a result, a metastable state also occurs in the flip-flop 9332 of the second stage, and this metastable state is propagated to the flip-flop 9333 of the third stage at timing t904, as shown in FIG. 14. In this way, signals of metastable state tend to be propagated successively to the later stages in the high-speed memory controller 30, and malfunction of elements in the high-speed controller may occur.

On the contrary, in the first embodiment, in each bus slave interface 31, the synchronizing unit 33 is in synchronous relation with clock φCLK2, and receives data in synchronism with clock φCLK3 slower than clock φCLK2, and transfers data to the speed-enhancing unit 34 in synchronism with clock φCLK3. The speed-enhancing unit 34 transfers the data received from the synchronizing unit 33 to the high-speed memory device 60 in synchronism with clock φCLK2 of high speed, and thereby increases the transfer speed of the data from the speed corresponding to clock φCLK3 to the speed corresponding to clock φCLK2. Accordingly, while the final data transfer speed is a high speed corresponding to clock φCLK2, the period of clock φCLK3 when receiving and transferring the asynchronously transferred data is sufficiently longer than term Tms of metastable state. As a result, while the final data transfer speed is a high speed, propagation of metastable state in the high-speed memory controller 30 can be decreased, and malfunction of elements in the high-speed controller 30 can be suppressed.

In the first embodiment, for example, if the operation frequency of the high-speed memory device 60 becomes higher, the problem can be solved only by re-designing of the speed-enhancing unit 34, and it is not required to re-design the entire bus slave interfaces 31, and the memory system 1 can be easily enhanced in performance and speed. At the time, the increase of design cost and manufacturing cost required by re-designing can be suppressed substantially.

In the first embodiment, moreover, the synchronizing unit 33 is connected to the low-speed bus 10, and includes a flip-flop 331 for receiving and holding data in synchronism with clock φCLK3, and a flip-flop 332 for holding the data output from the flip-flop 331 in synchronism with clock φCLK3. The speed-enhancing unit 34 has a flip-flop 341 for holding the data output from the flip-flop 332 in synchronism with clock φCLK2 of high speed. Accordingly, the synchronizing unit 33 and the speed-enhancing unit 34 can be realized in a simple structure.

Further in the first embodiment, the period of clock φCLK3 used by the synchronizing unit 33 when synchronizing is sufficiently longer than term Tms of the flip-flop 331 staying in a metastable state. That is, clock φCLK3 is determined by frequency-dividing clock φCLK2 of high speed, so that the period of clock φCLK3 may be longer than term Tms of metastable state preliminarily determined statistically. As a result, propagation of the metastable state of the flip-flop 331 to the flip-flop 332 can be securely decreased.

Note that, in the first embodiment, as a specific example of a case of receiving an asynchronous signal in a clock of shorter period than the term of metastable state, a memory system mounting a high-speed memory device and a high-speed memory controller for controlling it is specifically shown, but the concept of the first preferred embodiment may be also applied in other systems. It may be applied in other system in which asynchronous data transfer is executed from the bus masters 20-1 to 20-n to the bus slave, and the bus slave has plural bus slave interfaces 31-1 to 31-n.

Second Embodiment

Figure 5:
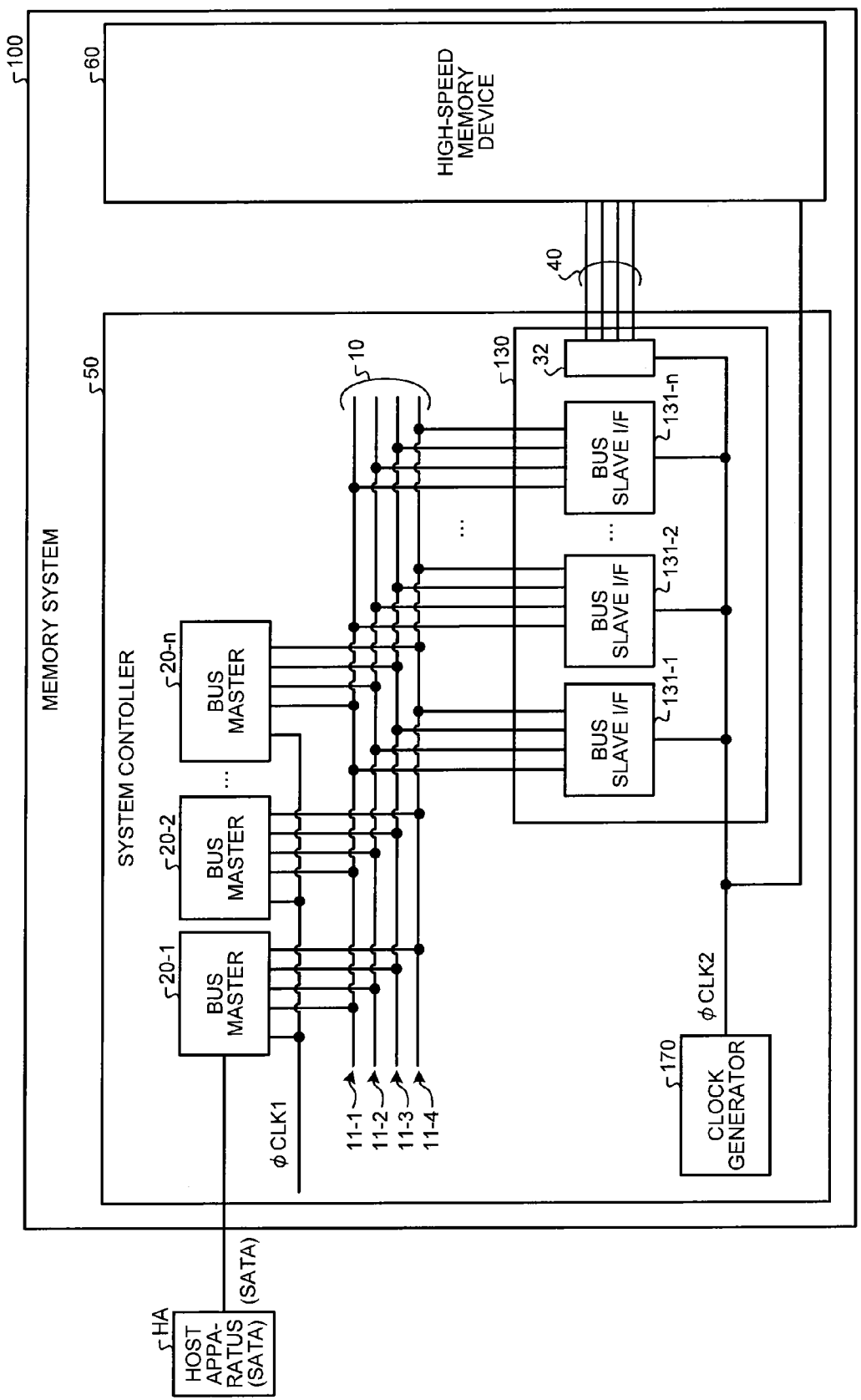
FIG. 5 is a diagram illustrating a configuration of a memory system in a second embodiment.
Figure 6:
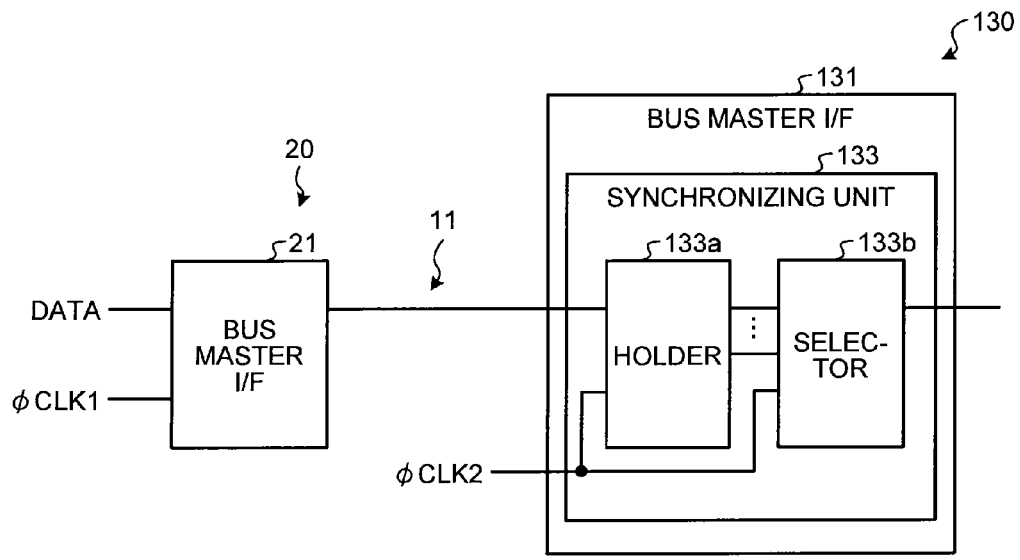
FIG. 6 is a diagram illustrating a configuration of a bus slave I/F in the second embodiment.
Figure 7:
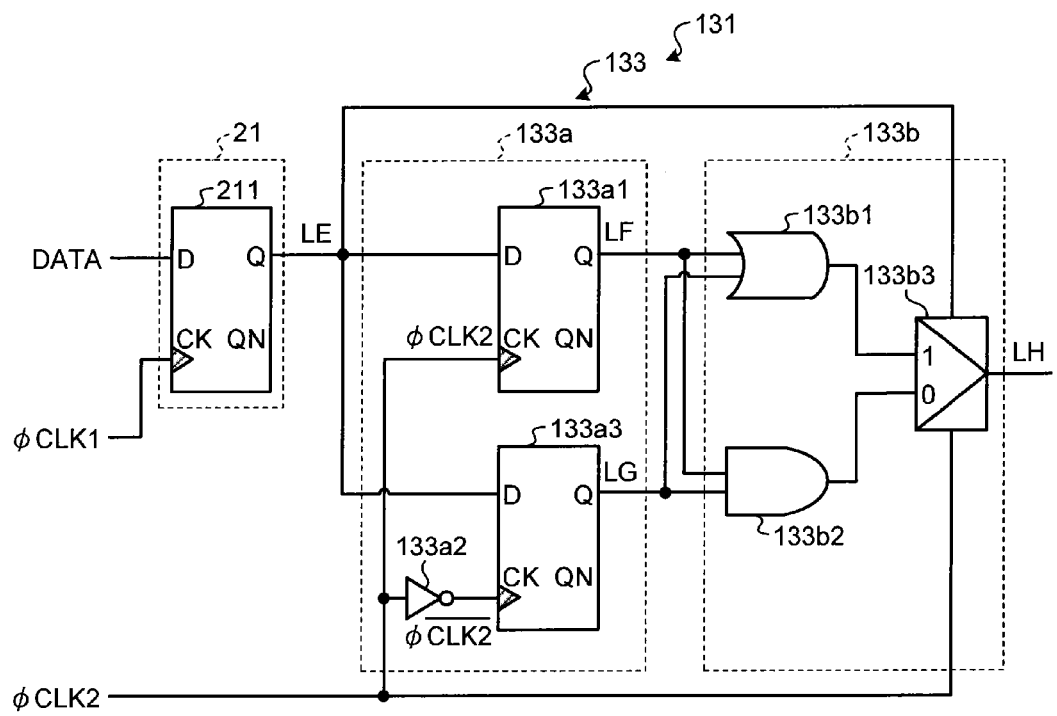
FIG. 7 is a diagram illustrating a configuration of a bus slave I/F in the second embodiment.

A memory system 100 in a second embodiment is described by referring to FIG. 5 to FIG. 7. FIG. 5 is a diagram illustrating a configuration of a memory system 100. FIG. 6 and FIG. 7 are exemplary diagrams illustrating the construction of the I/F circuit connected to one line 11 in bus slave interfaces 131. Mainly different points from the first embodiment are described below.

The memory system 100 differs from the first embodiment in the construction inside of bus slave interfaces 131-1 to 131-n in a high-speed memory controller (bus slave) 130.

That is, a clock generator 170 generates clock φCLK2, without generating clock φCLK3. The high-speed memory controller 130 receives clock φCLK2 from the clock generator 170, without receiving clock φCLK3 (see FIG. 1).

Each bus slave interface 131, as illustrated in FIG. 6, has a synchronizing unit 133, without having speed-enhancing unit 34 (see FIG. 2). The synchronizing unit 133 includes a holder 133a and a selector 133b.

The holder 133a receives data in synchronism with plural different phases in clock φCLK2, and holds as plural data. For example, the holder 133a receives and holds data in synchronism with rise of clock φCLK2, and then receives and holds data in synchronism with fall of clock φCLK2.

More specifically, as illustrated in FIG. 7, the holder 133a includes a flip-flop (fourth flip-flop) 133a1, an inverter 133a2, and a flip-flop (fifth flip-flop) 133a3. The flip-flop 133a1 has its input terminal D connected to line 11 (line LE), its clock terminal CK connected to the clock generator 170 (see FIG. 5), and its output terminal Q connected to the selector 133b. The inverter 133a2 has its input terminal connected to the clock generator 170 (see FIG. 5), and its output terminal connected to the flip-flop 133a3. The flip-flop 133a3 has its input terminal D connected to line 11 (line LE), its clock terminal CK connected to the inverter 133a2, and its output terminal Q connected to the selector 133b.

The inverter 133a2 inverts clock φCLK2, and generate inverted clock φ/CLK2, and supplies the inverted clock φ/CLK2 to the flip-flop 133a3 (hereinafter, "/" denotes inverting). The flip-flop 133a3 receives and holds data in synchronism with rise of the inverted clock φ/CLK2, and operates equivalent as when receiving and holding data in synchronism with fall of clock φCLK2.

The selector 133b selects one piece of stable data from plural data held in the holder 133a.

More specifically, the selector 133b includes an OR gate (first arithmetic unit) 133b1, an AND gate (second arithmetic unit) 133b2, and a selector (arithmetic result selector) 133b3. The OR gate 133b1 has its first input terminal connected to the output terminal of the flip-flop 133a1, its second input terminal connected to the output terminal of the flip-flop 133a3, and its output terminal connected to the selector 133b3. The AND gate 133b2 has its first input terminal connected to the output terminal of the flip-flop 133a1, its second input terminal connected to the output terminal of the flip-flop 133a3, and its output terminal connected to the selector 133b3. The selector 133b3 has its "1" side input terminal connected to the OR gate 133b1, its "0" side input terminal connected to the AND gate 133b2, and its control terminal connected to the line 11 (line LE).

The selector 133b3 selects either one of the arithmetic result of the OR gate 133b1 and the arithmetic result of the AND gate 133b2, depending on the level of the data received in the flip-flop 133a1 or the flip-flop 133a3. The selector 133b, when the data level after transition is H level, selects the arithmetic result of the OR gate 133b1 having a function of selecting the data of stable H level, and when the data level after transition is L level, selects the arithmetic result of the AND gate 133b2 having a function of selecting the data of stable L level.

The operation of the bus slave interfaces 131 differs from the first embodiment as illustrated in FIG. 8 to FIG. 11. FIG. 8 to FIG. 11 are waveform diagrams illustrating the operation of the bus slave interfaces 131.

Herein, the line 11 between the bus master interface 21, the flip-flop 133a1 and the flip-flop 133a3 is referred to as LE, the line between the flip-flop 133a1, the OR gate 133b1 and the AND gate 133b2 is referred to as LF, the line between the flip-flop 133a3, the OR gate 133b1 and the AND gate 133b2 is referred to as LG, and the line between the selector 133b3 and the rear stage is referred to as LH.

Figure 8:
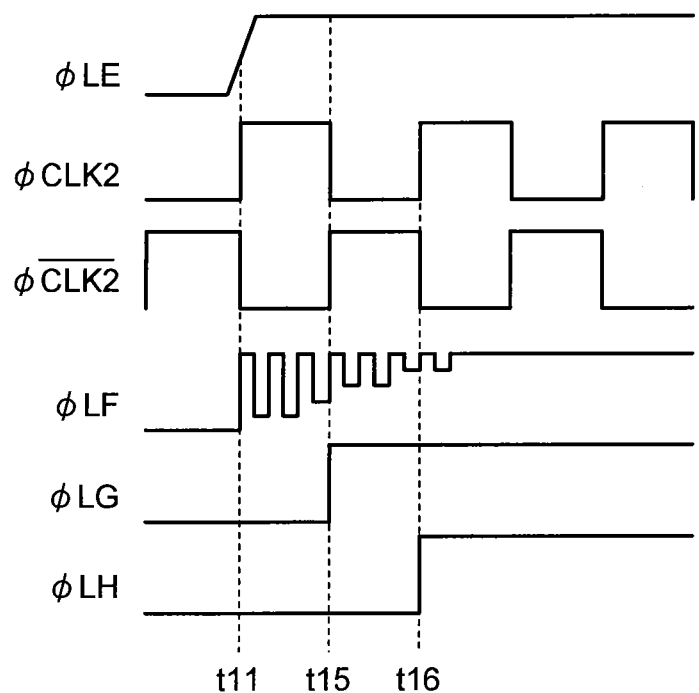
FIG. 8 is a diagram illustrating an operation of a bus slave I/F in the second embodiment.

At timing t11 illustrated in FIG. 8, the flip-flop 133a1 holds the data on line LE in synchronism with rise of clock φCLK2. At this time, the flip-flop 133a1 holds the data not established in level, and falls in a metastable state, and outputs data φLF of the level oscillated to line LF from its output terminal G.

At timing t15, the flip-flop 133a3 holds the data on line LE in synchronism with rise of inverted clock φ/CLK2. At this time, the flip-flop 133a1 holds the data established in level, and does not fall in a metastable state, and outputs data φLG of stable level to line LG from its output terminal G.

Afterwards, when the level of the received data φLE is H level, the selector 133b3 selects the arithmetic result of the OR gate 133b1, that is, the logical sum of data φLF and data φLG.

At timing t16, the selector 133b3 transfers the selected data to the rear stage as data φLH in synchronism with rise of clock φCLK2.

Figure 9:
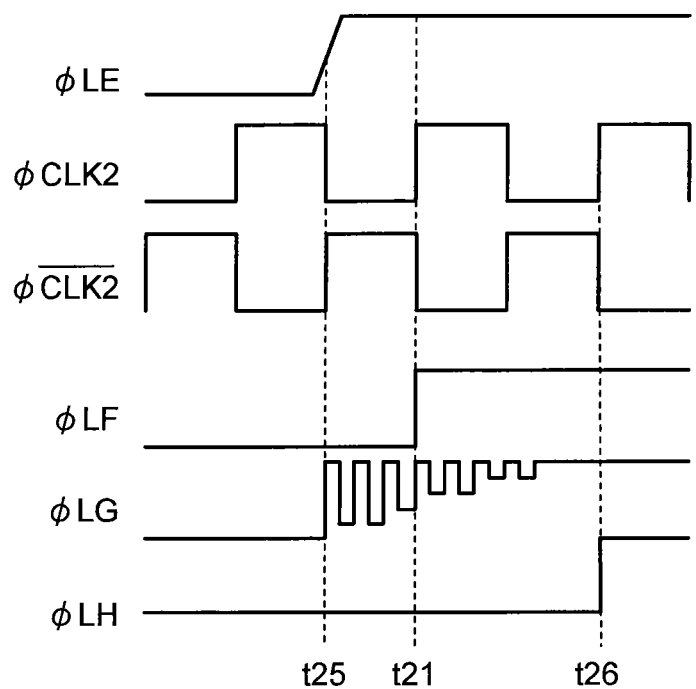
FIG. 9 is a diagram illustrating an operation of a bus slave I/F in the second embodiment.
Figure 12:
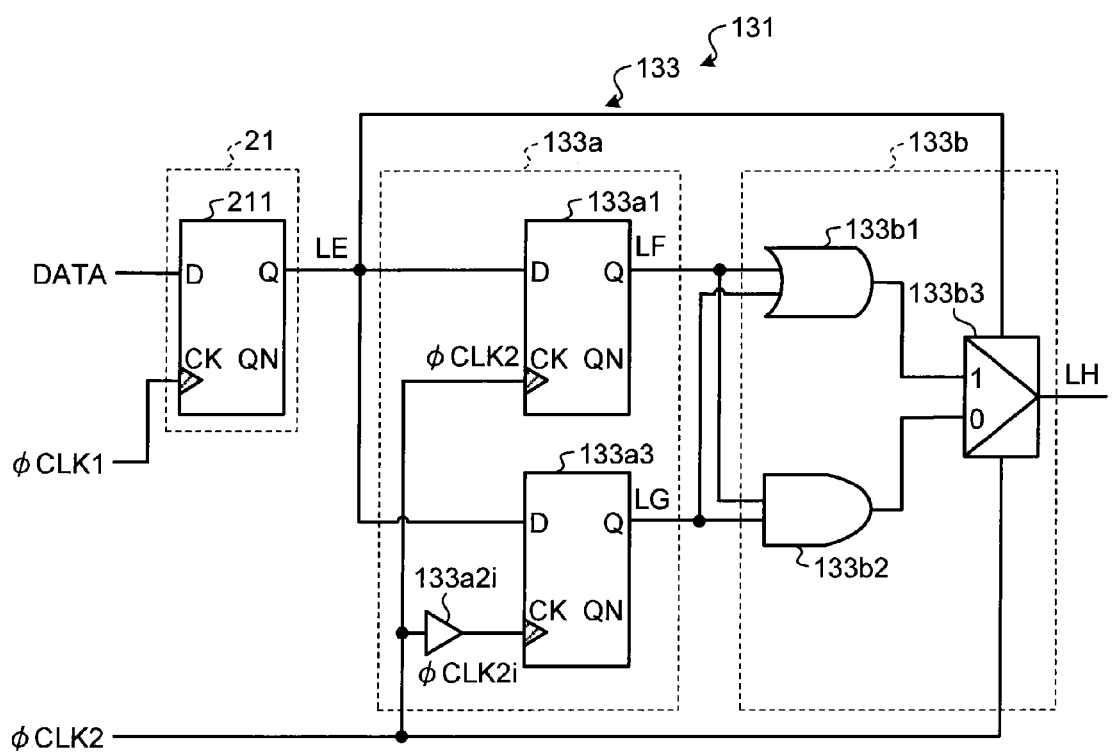
FIG. 12 is a diagram illustrating a configuration of a bus slave I/F in a modified example of the second embodiment.

At timing t25 illustrated in FIG. 9, the flip-flop 133a3 holds the data on line LE in synchronism with rise of inverted clock φ/CLK2. At this time, the flip-flop 133a1 holds the data not established in level, and falls in a metastable state, and outputs data φLG of the level oscillated to line LG from its output terminal G.

At timing t21, the flip-flop 133a1 holds the data on line LE in synchronism with rise of inverted clock φ/CLK2. At this time, the flip-flop 133a1 holds the data established in level, and does not fall in a metastable state, and outputs data φLF of stable level to line LF from its output terminal G.

Afterwards, when the level of the received data φLE is H level, the selector 133b3 selects the arithmetic result of the OR gate 133b1, that is, the logical sum of data φLF and data φLG.

At timing t26, the selector 133b3 transfers the selected data to the rear stage as data φLH in synchronism with rise of clock φCLK2.

At timing t31 illustrated in FIG. 10, the flip-flop 133a1 holds the data on line LE in synchronism with rise of inverted clock φ/CLK2. At this time, the flip-flop 133a1 holds the data not established in level, and falls in a metastable state, and outputs data φLF of the level oscillated to line LF from its output terminal G.

At timing t35, the flip-flop 133a3 holds the data on line LE in synchronism with rise of inverted clock φ/CLK2. At this time, the flip-flop 133a1 holds the data established in level, and does not fall in a metastable state, and outputs data φLG of stable level to line LG from its output terminal G.

Afterwards, when the level of the received data φLE is L level, the selector 133b3 selects the arithmetic result of the AND gate 133b2, that is, the logical product of data φLF and data φLG.

At timing t36, the selector 133b3 transfers the selected data to the rear stage as data φLH in synchronism with rise of clock φCLK2.

At timing t45 illustrated in FIG. 11, the flip-flop 133a3 holds the data on line LE in synchronism with rise of inverted clock φ/CLK2. At this time, the flip-flop 133a1 holds the data not established in level, and falls in a metastable state, and outputs data φLG of the level oscillated to line LG from its output terminal G.

At timing t41, the flip-flop 133a1 holds the data on line LE in synchronism with rise of inverted clock φ/CLK2. At this time, the flip-flop 133a1 holds the data established in level, and does not fall in a metastable state, and outputs data φLF of stable level to line LF from its output terminal G.

Afterwards, when the level of the received data φLE is L level, the selector 133b3 selects the arithmetic result of the AND gate 133b2, that is, the logical product of data φLF and data φLG.

At timing t46, the selector 133b3 transfers the selected data to the rear stage as data φLH in synchronism with rise of clock φCLK2.

In this manner, in the second embodiment, the holder 133a receives data in synchronism with plural different phases in clock φCLK2 and holds as plural data. As a result, at the timing synchronized with one phase out of the plural phases at clock φCLK2, if the level of the data to be received is not established, if there is any other timing synchronized with other phase at a deviated timing, it is highly possible that the level of the data to be received is established. That is, it is possible to hold the data established in the level in synchronism with any phase out of the plural phases in clock φCLK2. The selector 133b selects one stable data out of the plural data held in the holder 133a, and transfers to the rear stage. As a result, the metastable state of the flip-flop 133a1 or the flip-flop 133a3 will not be propagated to the rear stage. Hence, propagation of metastable state in the high-speed memory controller 130 can be reduced, and malfunction of elements in the high-speed memory controller 130 can be suppressed.

In the second embodiment, the holder 133a includes the flip-flop 133a1 connected to the low-speed bus 10 for receiving and holding the data in synchronism with clock φCLK2, the inverter 133a2 for generating inverted clock φ/CLK2 logically inverted from clock φCLK2, and the flip-flop 133a3 connected to the low-speed bus 10 for receiving and holding data in synchronism with the inverted clock φ/CLK2. Hence, the holder 133a receiving and holding the data in synchronism with rise and fall of clock φCLK2 can be realized in a simple structure.

In addition, since data is received in clock φCLK2 and inverted clock φ/CLK2, if one falls in a metastable state depending on the timing, other is shifted in phase by a half period, so that a stable signal can be transferred to a next stage.

In the second embodiment, the selector 133b includes the OR gate 133b1 for calculating the logical sum of the output of the flip-flop 133a1 and the output of the flip-flop 133a3, the AND gate 133b2 for calculating the logical product of the output of the flip-flop 133a1 and the output of the flip-flop 133a3, and the selector 133b3 for selecting one of the arithmetic result of the OR gate 133b1 and the arithmetic result of the AND gate 133b2, depending on the level of the data received in the flip-flop 133a1 or the flip-flop 133a3. As a result, the selector 133b capable of selecting one piece of stable data out of the plural data held by the holder 133a and transferring to a rear stage may be realized in a simple structure.

The configuration illustrated in FIG. 7 may be also modified to a configuration in which the OR gate 133b1 and the AND gate 133b2 are exchanged, and an inverter is inserted between line LE and the control terminal of the selector 133b3. In this case, too, the same operation as in the second embodiment may be realized.

Moreover, the holder 133a of each bus slave interface 131 may have a delay element 133a2i, instead of the inverter. The delay element 133a2i is composed, for example, by connecting an even number of (for example, two) inverters in series. The delay element 133a2i has its input terminal connected to the clock generator 170 (see FIG. 5), and its output terminal connected to the flip-flop 133a3. The delay element 133a2i generates a delayed clock φCLK2i by delaying clock φCLK2 by a specified delay amount, and supplies the delayed clock φCLK2i to the flip-flop 133a3. The flip-flop 133a3 receives and holds the data in synchronism with rise of delayed clock φCLK2i, so that the operation is equivalent to a case of receiving and holding the data in synchronism with a phase different from the rise of clock φCLK2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a bus master which transmits data by way of a bus;
a bus slave receiving the data by way of the bus; and
a memory device to which the data received in the bus slave is transferred,
wherein the bus master transmits the data in synchronism with a first clock,
the memory device operates in synchronism with a second clock which is in an asynchronous relation with the first clock and which is faster than the first clock, and
the bus slave includes:
a synchronizing unit connected to the bus, the synchronizing unit receiving the data in synchronism with a third clock which is in synchronous relation with the second clock and which is slower than the first clock; and
a speed-enhancing unit which enhances a transfer speed from a speed corresponding to the third clock to a speed corresponding to the second clock, by transferring the data received in the synchronizing unit to the memory device in synchronism with the second clock.

2. The memory system according to claim 1,
wherein the synchronizing unit includes:
a first flip-flop connected to the bus, the first flip-flop receiving and holding the data in synchronism with the third clock; and
a second flip-flop which holds the data output from the first flip-flop in synchronism with the third clock, and
the speed-enhancing unit includes a third flip-flop which holds the data output from the second flip-flop in synchronism with the second clock.

3. The memory system according to claim 2, wherein
a period of the third clock is longer than a term of the first flip-flop staying in a metastable state.

4. The memory system according to claim 2, further comprising a frequency-multiplier which frequency-multiplies the third clock, which generates the second clock, and which supplies the second clock to the third flip-flop.

5. A memory controller which controls a memory device, and which transfers data received from a bus master by way of a bus to the memory device,
wherein the bus master transmits the data in synchronism with a first clock,
the memory device operates in synchronism with a second clock which is in an asynchronous relation with the first clock and which is faster than the first clock, and
the memory controller includes:
a synchronizing unit connected to the bus, the synchronizing unit receiving the data in synchronism with a third clock which and is in synchronous relation with the second clock and which is slower than the first clock; and
a speed-enhancing unit which enhances a transfer speed from a speed corresponding to the third clock to a speed corresponding to the second clock, by transferring the data received in the synchronizing unit to the memory device in synchronism with the second clock.

6. The memory controller according to claim 5,
wherein the synchronizing unit includes:
a first flip-flop connected to the bus, the first flip-flop receiving and holding the data in synchronism with the third clock; and
a second flip-flop which holds the data output from the first flip-flop in synchronism with the third clock, and
the speed-enhancing unit includes a third flip-flop which holds the data output from the second flip-flop in synchronism with the second clock.

7. The memory controller according to claim 6, wherein
a period of the third clock is longer than a term of the first flip-flop staying in a metastable state.

8. A synchronizing apparatus which receives data transmitted from a bus master by way of a bus, and which transfers the received data to a specified device,
wherein the bus master transmits the data in synchronism with a first clock,
the specified device operates in synchronism with a second clock which is in an asynchronous relation with the first clock and which is faster than the first clock, and
the synchronizing apparatus includes:
a synchronizing unit connected to the bus, the synchronizing unit receiving the data in synchronism with a third clock which is in synchronous relation with the second clock and which is slower than the first clock; and
a speed-enhancing unit which enhances a transfer speed from a speed corresponding to the third clock to a speed corresponding to the second clock, by transferring the data received in the synchronizing unit to the specified device in synchronism with the second clock.

9. The synchronizing apparatus according to claim 8,
wherein the synchronizing unit includes:
a first flip-flop connected to the bus, the first flip-flop receiving and holding the data in synchronism with the third clock; and
a second flip-flop which holds the data output from the first flip-flop in synchronism with the third clock, and
the speed-enhancing unit includes a third flip-flop which holds the data output from the second flip-flop in synchronism with the second clock.

10. The synchronizing apparatus according to claim 9, wherein
a period of the third clock is longer than a term of the first flip-flop staying in a metastable state.

* * * * *